United States Patent
Zhu et al.

(10) Patent No.: US 9,571,044 B1
(45) Date of Patent: Feb. 14, 2017

(54) RF POWER TRANSISTORS WITH IMPEDANCE MATCHING CIRCUITS, AND METHODS OF MANUFACTURE THEREOF

(71) Applicant: FREESCALE SEMICONDUCTOR, INC., Austin, TX (US)

(72) Inventors: Ning Zhu, Chandler, AZ (US); Damon G. Holmes, Scottsdale, AZ (US); Jeffrey K. Jones, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/919,513

(22) Filed: Oct. 21, 2015

(51) Int. Cl.
*H03F 3/04* (2006.01)
*H03F 1/42* (2006.01)
*H03F 3/193* (2006.01)
*H03F 1/56* (2006.01)

(52) U.S. Cl.
CPC ............... *H03F 1/42* (2013.01); *H03F 1/565* (2013.01); *H03F 3/193* (2013.01); *H03F 2200/216* (2013.01); *H03F 2200/301* (2013.01); *H03F 2200/451* (2013.01)

(58) Field of Classification Search
CPC ......................................................... H03F 3/04
USPC ................................................. 330/302, 253
See application file for complete search history.

(56) References Cited

U.S. PATENT DOCUMENTS

| | | | |
|---|---|---|---|
| 3,434,070 A * | 3/1969 | Bartnik | H03F 1/48 330/124 R |
| 3,908,185 A | 9/1975 | Martin | |
| 4,717,884 A * | 1/1988 | Mitzlaff | H03F 3/217 330/251 |
| 5,066,925 A | 11/1991 | Freitag | |
| 5,072,690 A | 12/1991 | Ishikawa et al. | |
| 5,625,528 A | 4/1997 | Devoe et al. | |
| 5,736,901 A | 4/1998 | Nakamura | |
| 5,808,527 A | 9/1998 | De Los Santos | |
| 6,072,211 A | 6/2000 | Miller et al. | |
| 6,072,238 A | 6/2000 | Viswanathan et al. | |
| 6,081,160 A | 6/2000 | Custer et al. | |
| 6,507,101 B1 | 1/2003 | Morris | |

(Continued)

FOREIGN PATENT DOCUMENTS

| | | |
|---|---|---|
| WO | 0182672 A1 | 11/2001 |
| WO | 2009130544 A1 | 10/2009 |
| WO | 2010038111 A1 | 4/2010 |

OTHER PUBLICATIONS

Non-Final Office Action mailed Nov. 2, 2015 for U.S. Appl. No. 14/317,572, 10 pages.

(Continued)

*Primary Examiner* — Patricia T Nguyen
(74) *Attorney, Agent, or Firm* — Sherry W. Schumm

(57) ABSTRACT

Embodiments of an RF amplifier include a transistor with a control terminal and first and second current carrying terminals, and a shunt circuit coupled between the first current carrying terminal and a ground reference node. The shunt circuit includes a first shunt inductance, a second shunt inductance, and a shunt capacitor coupled in series. The second shunt inductance and the shunt capacitor form a series resonant circuit in proximity to a center operating frequency of the amplifier, and an RF cold point node is present between the first and second shunt inductances. The RF amplifier also includes a video bandwidth circuit coupled between the RF cold point node and the ground reference node.

20 Claims, 6 Drawing Sheets

(56) References Cited

U.S. PATENT DOCUMENTS

| | | | |
|---|---|---|---|
| 6,731,174 B2 | 5/2004 | Krvavac | |
| 6,822,321 B2 | 11/2004 | Crescenzi | |
| 7,029,971 B2 | 4/2006 | Borland | |
| 7,057,464 B2 | 6/2006 | Bharj | |
| 7,135,643 B2 | 11/2006 | Van Haaster et al. | |
| 7,368,668 B2 | 5/2008 | Ren et al. | |
| 7,372,334 B2 | 5/2008 | Blair et al. | |
| 7,412,007 B1* | 8/2008 | Richley | H04B 1/7174 375/296 |
| 7,564,303 B2 | 7/2009 | Perugupalli et al. | |
| 8,030,763 B2 | 10/2011 | Romero et al. | |
| 8,253,495 B2 | 8/2012 | Bouisse | |
| 8,324,728 B2 | 12/2012 | Tabrizi | |
| 8,350,367 B2 | 1/2013 | Chiu et al. | |
| 8,611,459 B2 | 12/2013 | McCallister | |
| 8,659,359 B2 | 2/2014 | Ladhani et al. | |
| 9,106,187 B2 | 8/2015 | Ladhani et al. | |
| 2005/0083723 A1* | 4/2005 | Blednov | H01L 24/49 365/154 |
| 2007/0024358 A1* | 2/2007 | Perugupalli | H01L 23/66 330/66 |
| 2007/0029662 A1 | 2/2007 | Lee | |
| 2007/0090515 A1 | 4/2007 | Condie et al. | |
| 2007/0158787 A1 | 7/2007 | Chanchani | |
| 2007/0273449 A1 | 11/2007 | Wilson | |
| 2008/0231373 A1* | 9/2008 | Rahman | H01L 23/66 330/302 |
| 2008/0246547 A1 | 10/2008 | Blednov | |
| 2009/0130544 A1 | 5/2009 | Chang et al. | |
| 2010/0038111 A1 | 2/2010 | Yabe et al. | |
| 2011/0031571 A1 | 2/2011 | Bouisse | |
| 2011/0156203 A1 | 6/2011 | Park | |
| 2012/0019334 A1 | 1/2012 | Hirai et al. | |
| 2012/0146723 A1* | 6/2012 | Blednov | H01L 23/66 330/192 |
| 2012/0154053 A1 | 6/2012 | Blair | |
| 2013/0033325 A1 | 2/2013 | Ladhani et al. | |
| 2014/0022020 A1 | 1/2014 | Aaen et al. | |
| 2014/0070365 A1 | 3/2014 | Viswanathan et al. | |
| 2014/0167855 A1 | 6/2014 | Ladhani et al. | |
| 2014/0167863 A1 | 6/2014 | Ladhani et al. | |
| 2014/0179243 A1 | 6/2014 | Bouisse et al. | |
| 2014/0333385 A1* | 11/2014 | Gutta | H03F 3/21 330/302 |
| 2015/0115893 A1 | 4/2015 | Lee et al. | |
| 2015/0263681 A1 | 9/2015 | Embar et al. | |

OTHER PUBLICATIONS

Non-Final Office Action mailed Apr. 11, 2016 for U.S. Appl. No. 14/942,419 11 pages.

Kahn, "Multilayer Ceramic Capacitors—Materials and Manufacture", Technical Information, AVX, Sep. 5, 2000, 8 pages.

U.S. Appl. No. 14/316,484, filed Jun. 26, 2014, entitled "Radio Frequency Devices With Surface-Mountable Capacitors for Decoupling and Methods Thereof".

Non-Final Office Action mailed Jan. 4, 2013 for U.S. Appl. No. 12/746,793, 10 pages.

Non-Final Office Action mailed May 28, 2013 for U.S. Appl. No. 12/746,793, 9 pages.

Notice of Allowance mailed Oct. 10, 2013 for U.S. Appl. No. 12/746,793, 7 pages.

Non-Final Office Action mailed Jul. 7, 2014 for U.S. Appl. No. 14/185,291, 15 pages.

Notice of Allowance mailed Mar. 5, 2015 for U.S. Appl. No. 14/185,291, 7 pages.

Notice of Allowance mailed Oct. 29, 2014 for U.S. Appl. No. 14/185,291, 6 pages.

Non-Final Office Action mailed Aug. 11, 2014 for U.S. Appl. No. 14/185,382, 12 pages.

Non-Final Office Action mailed Dec. 29, 2014 for U.S. Appl. No. 14/185,382, 9 pages.

Notice of Allowance mailed May 29, 2015 for U.S. Appl. No. 14/185,382, 5 pages.

Notice of Allowance mailed Oct. 29, 2015 for U.S. Appl. No. 13/611,793, 9 pages.

Restriction Requirement mailed Oct. 25, 2013 for U.S. Appl. No. 13/611,793, 5 pages.

Non-Final Office Action mailed Dec. 6, 2013 for U.S. Appl. No. 13/611,793, 14 pages.

Final Office Action mailed Sep. 4, 2014 for U.S. Appl. No. 13/611,793, 14 pages.

U.S. Appl. No. 14/317,572, filed Jun. 27, 2014, entitled "Integrated Passive Device Assemblies for RF Amplifiers, and methods of Manufacture".

U.S. Appl. No. 14/573,927, filed Dec. 17, 2014, entitled "Magnetically Coupled Load Modulation".

U.S. Appl. No. 14/919,990, filed Oct. 22, 2015, entitled "RF Amplifier Output Circuit Device With Integrated Current Path, and Methods of Manufacture Thereof".

U.S. Appl. No. 14/919,511, filed Oct. 21, 2015 entitled "RF Power Transistors With Video Bandwidth Circuits, and Methods of Manufacture Thereof".

Final Office Action mailed Oct. 14, 2016 for U.S. Appl. No. 15/050,176 9 pages.

Non-Final Office Action mailed Nov. 2, 2016 for U.S. Appl. No. 15/050,176 5 pages.

Notice of Allowance mailed May 6, 2016 for U.S. Appl. No. 14/317,572 9 pages.

Extended European Search Report for Patent Appln. No. 16169901.2 (Oct. 4, 2016).

* cited by examiner

RF POWER TRANSISTORS WITH IMPEDANCE MATCHING CIRCUITS, AND METHODS OF MANUFACTURE THEREOF

TECHNICAL FIELD

Embodiments of the subject matter described herein relate generally to packaged semiconductor devices, and more particularly to packaged, radio frequency (RF) semiconductor devices that include impedance matching circuits.

BACKGROUND

A typical high power, radio frequency (RF) semiconductor device may include one or more input leads, one or more output leads, one or more transistors, bondwires coupling the input lead(s) to the transistor(s), and bondwires coupling the transistor(s) to the output lead(s). The bondwires have significant inductive reactance at high frequencies, and such inductances are factored into the design of input and output impedance matching circuits for a device. In some cases, input and output impedance matching circuits may be contained within the same package that contains the device's transistor(s). More specifically, an in-package, input impedance matching circuit may be coupled between a device's input lead and a control terminal (e.g., the gate) of a transistor, and an in-package, output impedance matching circuit may be coupled between a current conducting terminal (e.g., the drain) of a transistor and a device's output lead.

Packaged RF semiconductor devices are available that have decent performance when used in relatively narrow-band applications with relatively low instantaneous signal bandwidth (ISBW) (e.g., ISBW of 150 megahertz (MHz) or less). However, increased ISBW (e.g., ISBW of 200 MHz or more) is becoming a major requirement for RF communication amplifiers (e.g., RF communication infrastructure amplifiers). This requirement stems from the fact that larger information download rates per second are becoming a significant enablement feature. Thus, trends in the RF communication industry include development of packaged RF semiconductor devices with increasingly wideband operation and relatively high ISBW.

Designing RF amplifier devices with high ISBW is challenging. For example, the ISBW of a device may be directly affected by the low frequency resonance (LFR) caused by interaction between the device's bias feeds and output circuits that are electrically connected between a device's transistor(s) and its output lead(s). More particularly, inductances of bondwires that interconnect various output circuit components may limit the LFR of the device.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
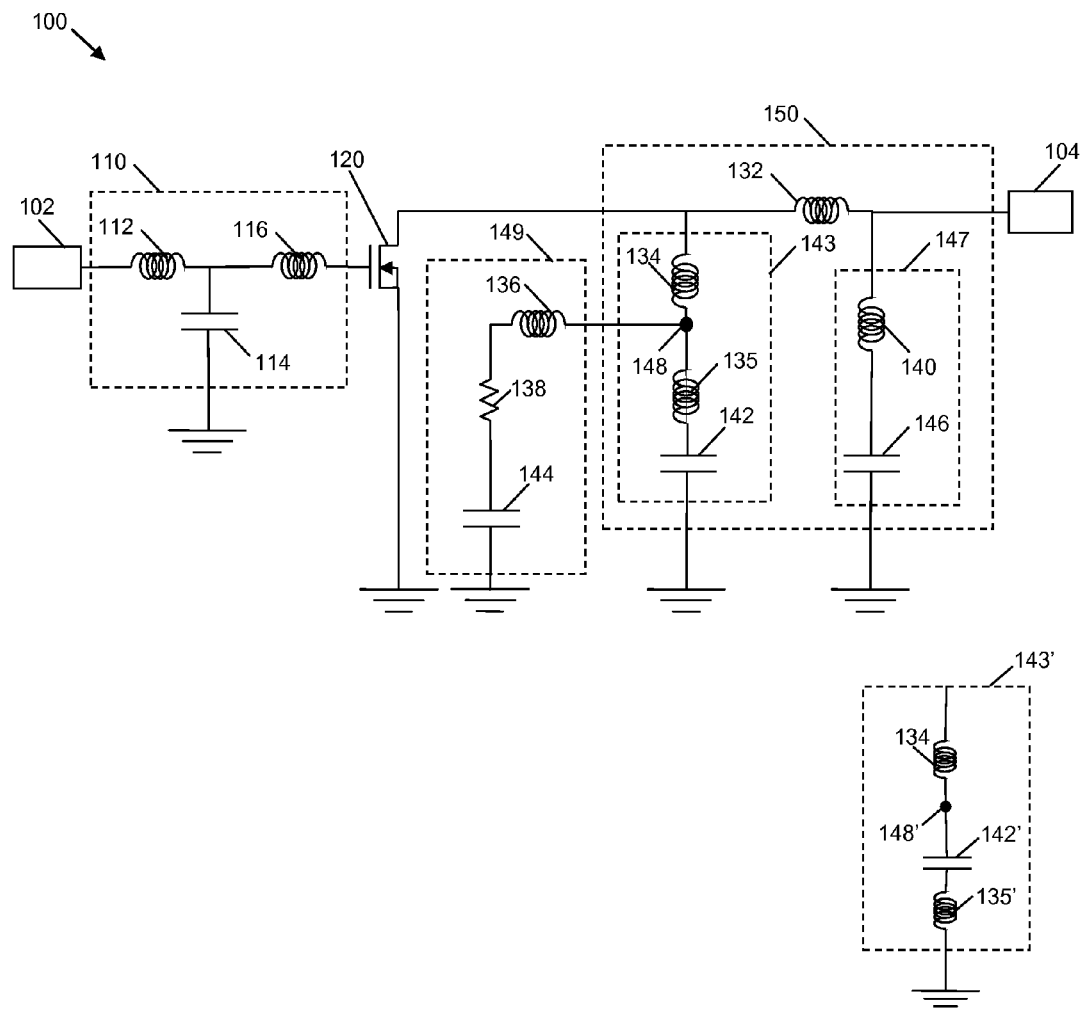
FIG. 1 is a schematic diagram of an RF amplifier with input and output impedance matching and envelope frequency termination circuits, in accordance with an example embodiment.

An output impedance matching circuit in a conventional RF power amplifier device may include, among other things, a shunt circuit that functions as a high-pass matching stage. For example, a conventional shunt circuit may include an inductor (herein "shunt inductor" or $L_{shunt}$) and a capacitor (herein "shunt capacitor" or $C_{shunt}$) coupled in series between a current conducting terminal (e.g., the drain) of the transistor and a ground reference node. In a conventional device, an "RF cold point" is located between the shunt inductor and the shunt capacitor. Essentially, the RF cold point is a node that may function as a virtual ground reference voltage for RF electrical signals. If the RF cold point were ideal, then during device operation, little or no RF energy at the power amplifier's center operating frequency would be present at the RF cold point. However, the RF cold point in a conventional shunt circuit is not ideal, and some RF energy at the center frequency is present at the RF cold point during operation.

To improve the low frequency resonance (LFR) of a device, and thus to increase the device's instantaneous signal bandwidth (ISBW), a device also may include an "envelope frequency termination circuit" (or "video bandwidth circuit") in the output impedance matching circuit. Essentially, a properly designed video bandwidth circuit is configured to have low impedance at envelope frequencies, so that the envelope current may readily pass through the video bandwidth circuit to ground, rather than being conveyed to the device's output lead. In a conventional device, the video bandwidth circuit is electrically coupled to the RF cold point (i.e., to a node between the shunt inductance and capacitance) so that the video bandwidth circuit is likely to be exposed only to a minimal amount of RF energy near the center operating frequency.

A typical video bandwidth circuit may include a series combination of an inductance (herein "envelope inductor" or $L_{env}$), a resistance (herein "envelope resistor" or $R_{env}$), and a capacitance (herein "envelope capacitor" or $C_{env}$) coupled between the RF cold point and the ground reference node. In a conventional device, due to imperfection of the RF cold point, a reasonably significant amount of RF energy at the center operating frequency may be present at the RF cold point during operation, and that RF energy may convey into the video bandwidth circuit and be dissipated by the envelope resistor. This undesirable power dissipation may manifest itself as a reduction in the drain efficiency of the device. Further, if the power dissipation becomes too high, it may compromise the integrity of the envelope resistor. In some devices, the envelope inductor value may be selected to present a high impedance to RF signals, thus deflecting RF signal from propagating through the video bandwidth circuit. A relatively large envelope inductor may result in a reduction in the power dissipation in the envelope resistor, thus potentially increasing drain efficiency. However, such a relatively large envelope inductor also may increase the video bandwidth circuit's baseband impedance and lower the LFR of the device. To achieve high linearization, the baseband impedance up to the LFR should be relatively low (e.g., 1.0 ohm or less). Conventional devices fail to achieve such a low baseband impedance up to the LFR.

Embodiments of the inventive subject matter include RF amplifiers and packaged semiconductor devices (e.g., packaged RF power transistor devices) that are configured to include a more ideal RF cold point than a conventional device. In other words, embodiments of RF amplifiers and devices include an RF cold point at which significantly less RF energy at the center operating frequency is present during operation, when compared with the RF energy that may be present at the RF cold point in a conventional RF amplifier or device. In addition, embodiments include a video bandwidth circuit that is connected to such a "more ideal" RF cold point. With the RF cold point of the various embodiments, the video bandwidth circuit design is not constrained to have to block significant amounts of RF energy near the center operating frequency, and thus may be designed with a relatively small envelope inductor while still achieving a relatively low baseband impedance (e.g., 1.0 ohm or less up to the LFR of the device). Without significant RF energy at the more ideal RF cold point, the device may avoid a drain efficiency performance penalty due to undesirable RF power dissipation in the envelope resistor. More specifically, with minimal RF energy present at the RF cold point, less power may be dissipated through the envelope resistor.

According to an embodiment, the RF cold point is improved by dividing the shunt inductance into two inductances. More specifically, a first shunt inductance is present between the transistor drain and a new RF cold point, and a second shunt inductance is coupled in series with the shunt capacitance between the new RF cold point and the ground reference node. According to an embodiment, the second shunt inductance and the shunt capacitance form a series resonant circuit in proximity to the center operating frequency of the RF power amplifier device, so that RF current near the center operating frequency that may be present at the new RF cold point will flow to ground through the shunt circuit, rather than flowing through the video bandwidth circuit. With less RF energy present at the new RF cold point, the video bandwidth circuit may be designed with a relatively low envelope inductance, and thus reduced baseband impedance up to the LFR. Further, less RF current flowing through the envelope resistor may translate into improved drain efficiency and a reduced potential for compromising the envelope resistor due to excessive power dissipation.

FIG. 1 is a schematic diagram of an RF power amplifier device 100. Device 100 includes an input lead 102, an input impedance matching circuit 110, a transistor 120, a video bandwidth circuit 149, an output impedance matching circuit 150, and an output lead 104, in an embodiment. The video bandwidth circuit 149 and the output impedance matching circuit 150 may be referred to collectively as an "output circuit." Although transistor 120 and various elements of the input and output impedance matching circuits 110, 150 and the video bandwidth circuit 149 are shown as singular components, the depiction is for the purpose of ease of explanation only. Those of skill in the art would understand, based on the description herein, that transistor 120 and/or certain elements of the input and output impedance matching circuits 110, 150 and the video bandwidth circuit 149 each may be implemented as multiple components (e.g., connected in parallel or in series with each other), and examples of such embodiments are illustrated in the other Figures and described later. For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 120 and various elements of the input and output impedance matching circuits 110, 150 and the video bandwidth circuit 149, below, thus are not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically positioned to span between the exterior and the interior of the device's package. Input impedance matching circuit 110 is electrically coupled between the input lead 102 and a first terminal of transistor 120 (e.g., the gate), which is also located within the device's interior. Similarly, output impedance matching circuit 150 and video bandwidth circuit 149 are electrically coupled between a second terminal of transistor 120 (e.g., the drain) and the output lead 104.

According to an embodiment, transistor 120 is the primary active component of device 100. Transistor 120 includes a control terminal and two current conducting terminals, where the current conducting terminals are spatially and electrically separated by a variable-conductivity channel. For example, transistor 120 may be a field effect transistor (FET) (such as a metal oxide semiconductor FET (MOSFET)), which includes a gate (control terminal), a drain (a first current conducting terminal), and a source (a second current conducting terminal). Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 120 is coupled to the input impedance matching circuit 110, the drain of transistor 120 is coupled to the output impedance matching circuit 150 and the video bandwidth circuit 149, and the source of transistor 120 is coupled to ground (or another voltage reference). Through the variation of control signals provided to the gate of transistor 120, the current between the current conducting terminals of transistor 120 may be modulated.

Input impedance matching circuit 110 is coupled between the input lead 102 and the control terminal (e.g., gate) of the transistor 120. Input impedance matching circuit 110 is configured to raise the impedance of device 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface).

According to an embodiment, input impedance matching circuit 110 includes two inductive elements 112, 116 (e.g., two sets of bondwires) and a shunt capacitor 114. A first inductive element 112 (e.g., a first set of bondwires) is coupled between input lead 102 and a first terminal of capacitor 114, and a second inductive element 116 (e.g., a second set of bondwires) is coupled between the first terminal of capacitor 114 and the control terminal of transistor 120. The second terminal of capacitor 114 is coupled to ground (or another voltage reference). The combination of inductive elements 112, 116 and shunt capacitor 114 functions as a low-pass filter. According to an embodiment, the series combination of inductive elements 112, 116 may have a value in a range between about 50 picohenries (pH) to about 3 nanohenries (nH), and shunt capacitor 114 may have a value in a range between about 5 picofarads (pF) to about 80 pF.

Output impedance matching circuit 150 is coupled between the first current conducting terminal (e.g., drain) of transistor 120 and the output lead 104. Output impedance matching circuit 150 is configured to match the output impedance of device 100 with the input impedance of an external circuit or component (not shown) that may be coupled to output lead 104. According to an embodiment, output impedance matching circuit 150 includes four inductive elements 132, 134, 135, 140 and two capacitors 142, 146. A first inductive element 132 (e.g., a third set of bondwires), which may be referred to herein as a "series inductor" or $L_{series}$, is coupled between the first current conducting terminal (e.g., drain) of transistor 120 and the output lead 104. A second inductive element 134 (e.g., a fourth set of bondwires, an integrated inductor, or another inductive structure), which may be referred to herein as a "first shunt inductor" or $L_{shunt1}$, is coupled between the first current conducting terminal of transistor 120 and first node 148, which corresponds to an RF cold point node, in an embodiment. A third inductive element 135 (e.g., a fifth set of bondwires, an integrated inductor, or another inductive structure), which may be referred to herein as a "second shunt inductor" or $L_{shunt2}$, is coupled between the RF cold point node 148 and a first terminal of a first capacitor 142, which may be referred to herein as a "shunt capacitor." In an alternate embodiment of the shunt circuit 143', as can be seen in the lower right corner of FIG. 1, the order of the second shunt inductor 135' and the shunt capacitor 142' between the RF cold point node 148' and the ground reference may be reversed. Finally, a fourth inductive element 140 (e.g., a fifth or sixth set of bondwires), which may be referred to herein as an "low-pass matching inductor," is coupled between the output lead 104 and a first terminal of a second capacitor 146, which may be referred to herein as an "low-pass matching capacitor." Second terminals of the shunt and low-pass matching capacitors 142, 146 are coupled to ground (or to another voltage reference), in an embodiment.

The first and second shunt inductors 134, 135 and the shunt capacitor 142 are coupled in series between a current conducting terminal of transistor 120 and ground, and this combination of impedance matching elements functions as a first (high-pass) matching stage. Accordingly, the combination of shunt inductors 134, 135 and shunt capacitor 142 may be referred to herein as a high-pass matching circuit 143. According to an embodiment, the series combination of shunt inductors 134, 135 may have a value in a range between about 100 pH to about 3 nH, and shunt capacitor 142 may have a value in a range between about 50 pF to about 500 pF, although these components may have values outside of these ranges, as well.

An RF cold point 148 is present at the node between the first and second shunt inductors 134, 135. As discussed previously, the RF cold point 148 represents a low impedance point in the circuit for RF signals. As will be described in more detail later in conjunction with FIGS. 2-7, various embodiments of RF amplifier devices may include at least one integrated passive device (IPD) assembly (e.g., IPD assembly 400, 600, FIGS. 4, 6), which includes portions of the output circuit. More specifically, each IPD assembly may include a semiconductor substrate with one or more integrated passive components. In a particular embodiment, each IPD assembly may include RF cold point 148, second shunt inductor 135, shunt capacitor 142, and portions of video bandwidth circuit 149. In other embodiments, some or all of these portions of the output impedance matching and video bandwidth circuits 150, 149 may be implemented as distinct/discrete components or as portions of other types of assemblies (e.g., a low-temperature co-fired ceramic (LTCC) device, a small PCB assembly, and so on). In still other embodiments, some or all of these portions of the output impedance matching and video bandwidth circuits 150, 149 may be coupled to and/or integrated within the semiconductor die that includes transistor 120. The below, detailed description of embodiments that include IPD assemblies should not be taken to limit the inventive subject matter, and the term "passive device substrate" means any type of structure that includes a passive device, including an IPD, a LTCC device, a transistor die, a PCB assembly, and so on.

Video bandwidth circuit 149 is coupled between the RF cold point 148 and ground (or another voltage reference). Video bandwidth circuit 149 functions to improve the LFR of device 100 caused by the interaction between the output impedance matching circuit 150 and the bias feeds (not shown) by presenting a low impedance at envelope frequencies and a high impedance at RF frequencies. Video bandwidth circuit 149 essentially is "invisible" from an RF matching standpoint, as it only effects the output impedance at envelope frequencies (i.e., video bandwidth circuit 149 provides terminations for the envelope frequencies of device 100).

According to an embodiment, video bandwidth circuit 149 includes an inductance 136, a resistor 138, and a capacitor 144 coupled in series. According to an embodiment, the inductance 136, $L_{env}$, may be implemented as a set of bondwires coupling RF cold point 148 to the envelope resistor 138, $R_{env}$. In such an embodiment, envelope inductance 136 may have a value in a range between about 5 pH to about 2000 pH. In another embodiment, which will be discussed in more detail in conjunction with FIGS. 2-7, the envelope inductance 136 may be accomplished without bondwire connections between the RF cold point 148 and the other components of the video bandwidth circuit 149 (i.e., resistor 138 and capacitor 144). More particularly, other embodiments of RF amplifier devices also may incorporate the envelope inductance 136, the envelope resistor 138, and the envelope capacitor 144 into the aforementioned embodiments of IPD assemblies (e.g., IPD assembly 400, 600, FIGS. 4, 6), or into the die that includes transistor 120. Within an IPD assembly (or within the transistor die), the video bandwidth circuit 149 components may be coupled together and to ground (or another voltage reference) with connections having very low and tightly controlled inductance. Tight control of the envelope inductance 136 is achieved, according to various embodiments, by connecting the envelope resistor 138 and envelope capacitor 144 to the RF cold point 148 (e.g., contact pad 448, 648) through photolithographically formed connections within the IPD assembly (e.g., conductive traces and vias), rather than through bondwires. The IPD assemblies of the various embodiments may substantially reduce and control the inductance value of envelope inductance 136, thus reducing the total inductance included in the video bandwidth circuit 149. This may have the effect of improving both the LFR and ISBW of the device 100.

Although envelope inductance 136 is represented as a single component in FIG. 1, in actuality envelope inductance 136 may consist of multiple small inductances from multiple low-inductance connections within the envelope frequency termination circuit 149. According to an embodiment, a first terminal of envelope resistor 138 is coupled to the RF cold point 148, through a first low-inductance connection (e.g., a portion of contact pad 448, FIG. 4) that represents a first portion of envelope inductance 136. A second terminal of envelope resistor 138 is coupled to a first terminal of envelope capacitor 144 through a second low-inductance connection (e.g., contact pad 430, FIG. 4) that represents a second portion of envelope inductance 136. A second terminal of the envelope capacitor 144 is coupled to ground (or another voltage reference), in an embodiment, through a third low-inductance connection (e.g., bond pad 432 and vias 436, FIG. 4) that represents a third portion of envelope inductance 136. Envelope resistor 138 may have a value in a range between about 0.1 ohm to about 5.0 ohm, and envelope capacitor 144 may have a value in a range between about 5 nanofarads (nF) to about 1 microfarad (μF), although these components may have values outside of these ranges, as well. Envelope inductance 136 due to the low-inductance connections between shunt capacitor 142, inductor 135, resistor 138, capacitor 144, and ground (or another voltage reference) may have a value less than about 500 pH, in an embodiment (e.g., as low as 50 pH, in an embodiment, or possibly even lower).

Low-pass matching inductor 140 and low-pass matching capacitor 146 are coupled in series between the output lead 104 and ground (or another voltage reference), and this combination of impedance matching elements functions as a second (low-pass) matching stage. Accordingly, the combination of low-pass matching inductor 140 and low-pass matching capacitor 146 may be referred to herein as a low-pass matching circuit 147. According to an embodiment, low-pass matching inductor 140 may have a value in a range between about 50 pH to about 1 nH, and low-pass matching capacitor 146 may have a value in a range between about 1 pF to about 50 pF, although these components may have values outside of these ranges, as well. According to an alternate embodiment, low pass matching circuit 147 may be excluded altogether from device 100.

Figure 2:
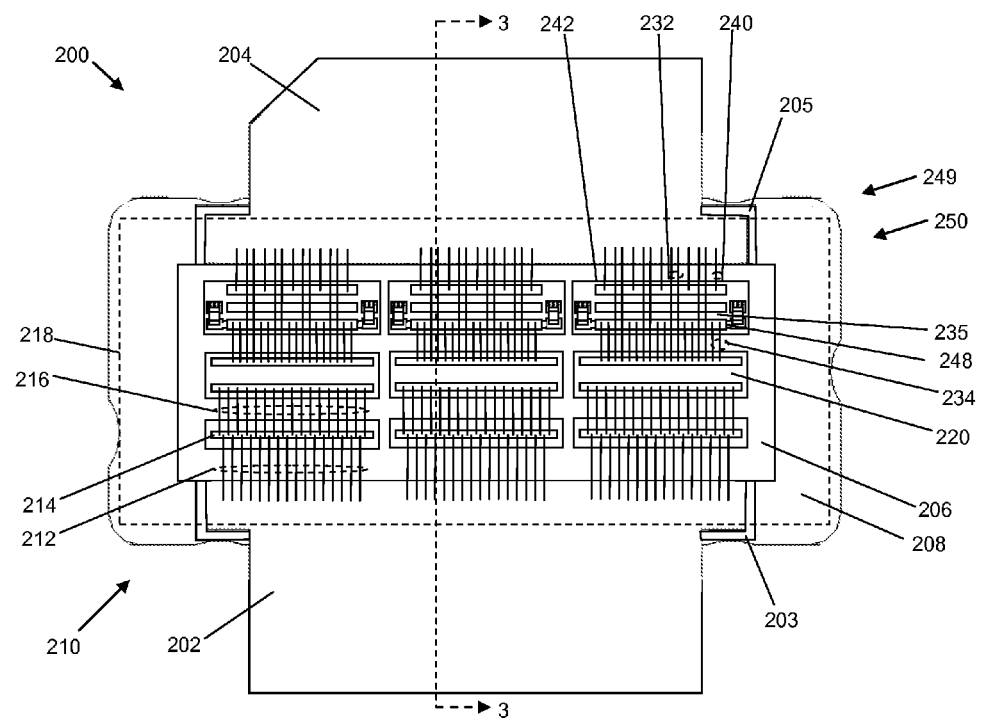
FIG. 2 is a top view of an example of a packaged RF amplifier device that embodies the circuit of FIG. 1, in accordance with an example embodiment.
Figure 3:
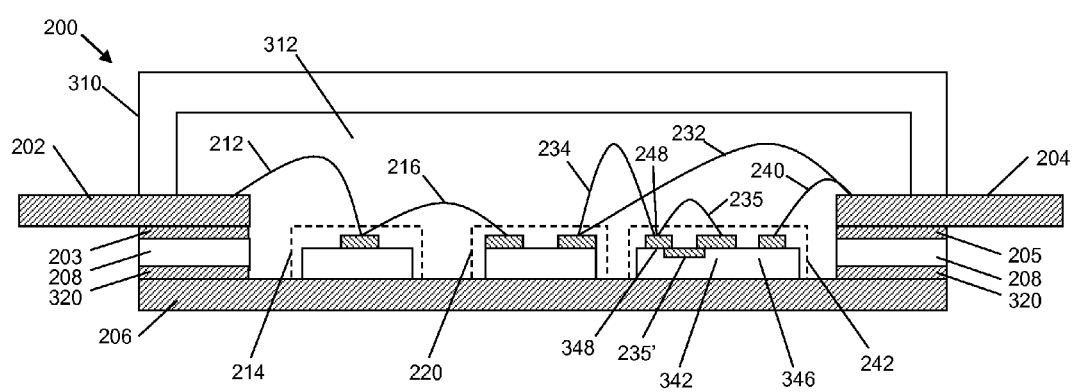
FIG. 3 is a cross-sectional, side view of the RF amplifier device of FIG. 2 along line 3-3.

FIG. 2 is a top view of an example of a packaged RF amplifier device 200 that embodies the circuit of FIG. 1, and that includes an output impedance matching circuit 250 with an improved RF cold point node 248 to which a video bandwidth circuit 249 is coupled, in accordance with an example embodiment. For enhanced understanding, FIG. 2 should be viewed in conjunction with FIG. 3, which is a cross-sectional, side view of the semiconductor device 200 of FIG. 2 along line 3-3. More specifically, FIG. 3 is a cross-sectional view through input lead 202, input impedance matching circuit 210, transistor 220, output impedance matching circuit 250, and output lead 204. FIG. 3 also illustrates a cap 310, which may be implemented in air cavity package embodiments to seal the interior components of device 200 within an air cavity 312.

Device 200 includes an input lead 202 (e.g., input lead 102, FIG. 1), an output lead 204 (e.g., output lead 104, FIG. 1), a flange 206 (or "device substrate"), an isolation structure 208, one or more transistors 220 (e.g., transistor 120, FIG. 1), an input impedance matching circuit 210 (e.g., input impedance matching circuit 110, FIG. 1), a video bandwidth circuit 249 (e.g., video bandwidth circuit 149, FIG. 1), and an output impedance matching circuit 250 (e.g., output impedance matching circuit 150, FIG. 1), all of which may be packaged together as parts of the device. In the example of FIG. 2, device 200 includes three transistors 220 that essentially function in parallel, although another semiconductor device may include one or two transistors or more than three transistors, as well. In addition, device 200 includes three input capacitors 214 and three IPD assemblies 242, which also essentially function in parallel. It is to be understood that more or fewer of capacitors 214 and/or IPD assemblies 242 may be implemented, as well. For purposes of clarity, transistors 220, input capacitors 214, and IPD assemblies 242 each may be referred to in the singular sense, below, as will analogous components in other, later-described Figures. It is to be understood that the description of a particular device component in the singular sense applies to the set of all such components. According to an embodiment, jumper wires (not illustrated) may be electrically coupled between the multiple transistors 220, input capacitors 214, and IPD assemblies 242, in order to provide low frequency paths between corresponding components.

According to an embodiment, device 200 is incorporated in an air cavity package, in which transistors 220 and various impedance matching and video bandwidth elements 212, 214, 216, 232, 234, 240, and 242 are located within an enclosed air cavity 312. Basically, the air cavity is bounded by flange 206, isolation structure 208, and a cap 310 overlying and in contact with the isolation structure 208 and leads 202, 204. In FIG. 2, an example perimeter of the cap 310 is indicated by dashed box 218. In other embodiments, a device may be incorporated into an overmolded package (i.e., a package in which the electrical components within the active device area are encapsulated with a non-conductive molding compound, and in which portions of the leads 202, 204, and all or portions of the isolation structure 208 also may be encompassed by the molding compound).

Flange 206 includes a rigid electrically-conductive substrate, which has a thickness that is sufficient to provide structural support for electrical components and elements of device 200. In addition, flange 206 may function as a heat sink for transistors 220 and other devices mounted on flange 206. Flange 206 has a top and bottom surface (only a central portion of the top surface is visible in FIG. 2), and a substantially-rectangular perimeter that corresponds to the perimeter of the device 200 (e.g., to the perimeter of isolation structure 208, described below).

Flange 206 is formed from a conductive material, and may be used to provide a ground reference for the device 200. For example, various components and elements may have terminals that are electrically coupled to flange 206, and flange 206 may be electrically coupled to a system ground when the device 200 is incorporated into a larger electrical system. At least the surface of flange 206 is formed from a layer of conductive material, and possibly all of flange 206 is formed from bulk conductive material. Alternatively, flange 206 may have one or more layers of non-conductive material below its top surface. Either way, flange 206 has a conductive top surface. Flange 206 may more generally be referred to as a substrate with a conductive surface.

Isolation structure 208 is attached to the top surface of flange 206. For example, isolation structure 208 may include a layer of metallization 320 on its bottom surface, which may be soldered to or otherwise attached to the top surface of flange 206. Isolation structure 208 is formed from a rigid, electrically insulating material (i.e., a material with a dielectric constant in a range from about 2.0 to about 10.0, although materials with higher or lower dielectric constants may be used), and has a top surface and an opposed bottom surface. The term "isolation structure," as used herein, refers to a structure that provides electrical isolation between conductive features of a device (e.g., between leads 202, 204 and flange 206). For example, isolation structure 208 may be formed from inorganic materials (e.g., ceramic such as aluminum oxide, aluminum nitride, and so on) and/or organic materials (e.g., one or more polymers or PCB materials). In an embodiment in which isolation structure 208 comprises PCB materials (e.g., the isolation structure 208 essentially includes a single or multi-layer PCB), conductive layers (e.g., copper layers) may be included on the top and bottom surfaces of the isolation structure. In a further embodiment, a conductive layer on the top surface of the isolation structure 208 may be patterned and etched to form a leadframe (including leads 202, 204) for the device 200, and a conductive layer on the bottom surface of the isolation structure 208 may be coupled to the flange 206. In other embodiments, conductive layers may be excluded from the top and/or bottom surface of the isolation structure 208. In such embodiments, leads (e.g., leads 202, 204) may be coupled to the isolation structure 208 using epoxy (or other adhesive materials), and/or the isolation structure 208 may be coupled to the flange 206 using epoxy (or other adhesive materials). In still other embodiments, the isolation structure 208 may be milled at the portion of its top surface to which a lead is attached.

Isolation structure 208 has a frame shape, in an embodiment, which includes a substantially enclosed, four-sided structure with a central opening. Isolation structure 208 may have a substantially rectangular shape, as shown in FIG. 2, or isolation structure 208 may have another shape (e.g., annular ring, oval, and so on). Isolation structure 208 may be formed as a single, integral structure, or isolation structure 208 may be formed as a combination of multiple members. In addition, isolation structure 208 may be formed from a homogenous material, or isolation structure 208 may be formed from multiple layers.

The input and output leads 202, 204 are mounted on a top surface of the isolation structure 208 on opposed sides of the central opening, and thus the input and output leads 202, 204 are elevated above the top surface of the flange 206, and are electrically isolated from the flange 206. For example, the input and output leads 202, 204 may be soldered or otherwise attached to metallization 203, 205 on a top surface of isolation structure 208. The metallization 203, 205 may be considered to be conductive pads to which the input and output leads 202, 204 are coupled. Generally, the input and output leads 202, 204 are oriented in order to allow for attachment of bondwires (e.g., bondwires 212, 232, 240) between the input and output leads 202, 204 and components and elements within the central opening of isolation structure 208.

Transistors 220 and various elements 214, 242 of the input and output impedance matching circuits 210, 250 and video bandwidth circuits 249 are mounted on a generally central portion of the top surface of a flange 206 that is exposed through the opening in isolation structure 208. According to an embodiment, transistors 220 are positioned within the active device area of device 200, along with impedance matching and video bandwidth elements 214, 242. For example, the transistors 220, capacitors 214, and IPD assemblies 242 may be coupled to flange 206 using conductive epoxy, solder, solder bumps, sintering, and/or eutectic bonds.

Each transistor 220 has a control terminal (e.g., a gate) and two current conducting terminals (e.g., a drain and a source). The control terminal of each transistor 220 is coupled to the input impedance matching circuit 210. In addition, one current conducting terminal (e.g., the drain) is coupled to the output impedance matching circuit 250 and to the output lead 204. The other current conducting terminal (e.g., the source) is coupled to the flange 206 (e.g., to ground), in an embodiment.

The input impedance matching circuit 210 (e.g., input impedance matching circuit 110, FIG. 1) is coupled between the input lead 202 (e.g., input lead 102, FIG. 1) and the control terminal of the transistor 220 (e.g., transistor 120, FIG. 1). In the device 200 of FIG. 2, the input impedance matching circuit 210 includes two inductive elements 212, 216 (e.g., inductive elements 112, 116, FIG. 1) and a capacitor 214 (e.g., capacitor 114, FIG. 1). Each inductive element 212, 216 is formed from a plurality of parallel, closely-spaced sets of bondwires, in an embodiment. For example, a first inductive element 212 (e.g., inductive element 112, FIG. 1) includes a plurality of bondwires coupled between input lead 202 and a first terminal of capacitor 214 (e.g., capacitor 114, FIG. 1), and a second inductive element 216 (e.g., inductive element 116, FIG. 1) includes a plurality of bondwires coupled between the first terminal of capacitor 214 and the control terminal of transistor 220. The second terminal of capacitor 214 is coupled to the flange 206 (e.g., to ground). Capacitor 214 may be, for example, a discrete silicon capacitor, a discrete ceramic capacitor, or another type of capacitor. Bondwires 212, 216 are attached to a conductive top plate at the top surface of capacitor 214.

The output impedance matching circuit 250 (e.g., output impedance matching circuit 150, FIG. 1) is coupled between a first current conducting terminal (e.g., drain) of transistor 220 (e.g., transistor 120, FIG. 1) and the output lead 204 (e.g., output lead 104, FIG. 1). In the device 200 of FIG. 2, the output impedance matching circuit 250 includes four inductive elements 232, 234, 235 or 235' (FIG. 3), 240 (e.g., inductors 132, 134, 135, 140, FIG. 1) and two capacitors 342, 346 (e.g., capacitors 142, 146, FIG. 1). As is more clearly indicated in FIG. 3, the capacitors 342, 346 of output impedance matching circuit 250 may be included in IPD assembly 242, according to an embodiment. In other embodiments, the capacitors 342 and/or 346 may not form a portion of an IPD assembly, but instead may be discrete capacitors that are distinct from each other, or capacitors that are formed in another type of assembly (e.g., an LTCC assembly). In still other alternate embodiments, either or both of the capacitors 342, 346 may be integrated into the transistor die (e.g., a die that includes transistor 220). As part of an IPD assembly 242, capacitors 342, 346 will be illustrated and described in more detail in conjunction with FIGS. 5 and 7. In an embodiment in which low-pass matching circuit 147 is excluded, IPD assembly 242 may exclude capacitor 346 (e.g., capacitor 146, FIG. 1).

Inductive elements 232, 234, 240 each may be formed from a plurality of parallel, closely-spaced sets of bondwires, in an embodiment. For example, a series inductive element 232 (e.g., series inductor 132, FIG. 1) includes a plurality of bondwires coupled between the first current conducting terminal (e.g., the drain) of transistor 220 and the output lead 204. A first shunt inductive element 234 (e.g., first shunt inductor 134, FIG. 1) may include a plurality of bondwires coupled between the first current conducting terminal of transistor 220 and the RF cold point node 248 (e.g., RF cold point 148, FIG. 1), which may be implemented as a conductive landing pad at the top surface of IPD assembly 242, in an embodiment. As will be described in more detail in conjunction with FIGS. 4-7, a second shunt inductive element may be implemented as a plurality of bondwires 235, in an embodiment, or as an integrated inductor 235', in another embodiment. Either way, the second shunt inductive element 235, 235' is electrically coupled between the RF cold point node 248 and a first terminal of shunt capacitor 342 (e.g., shunt capacitor 142, FIG. 1). In alternate embodiments, either or both of the shunt inductive elements 234, 235, 235' may be coupled to and/or integrated into the transistor die (e.g., a die that includes transistor 220). For example, the first shunt inductive element 234 could be implemented as a plurality of bondwires coupled between two conductive landing pads at the top surface of the transistor die, in an embodiment, or as an integrated inductive element (e.g., a transmission line or an integrated spiral inductor) in the transistor die, in another embodiment. Similarly, the second shunt inductive element 235, 235' could be implemented as a plurality of bondwires coupled between two conductive landing pads at the top surface of the transistor die, in an embodiment, or as an integrated inductive element (e.g., a transmission line or an integrated spiral inductor) in the transistor die, in another embodiment.

A low-pass matching inductive element 240 (e.g., low-pass matching inductor 140, FIG. 1) includes a plurality of bondwires coupled between the output lead 204 and another conductive landing pad at the top surface of IPD assembly 242, which in turn is electrically connected to a first terminal of low-pass matching capacitor 346 (e.g., low-pass matching capacitor 146, FIG. 1). Second terminals of capacitors 342, 346 are electrically connected to the flange 206 (e.g., to ground).

The embodiment of FIG. 2 corresponds to a two-lead device (e.g., a device having one input lead 202 and one output lead 204, FIG. 2). Such a device may be incorporated into a larger electrical system by physically coupling the device to a PCB, electrically connecting the input lead to a signal source, and electrically connecting the output lead to a load. The PCB may further include one or more bias feeds (e.g., each with a length of lambda/4 or some other length) with proximal ends located close to the PCB connection(s) to the output lead and/or input lead. A blocking capacitor at the distal end of each bias lead may provide a short at a given RF frequency, which when transformed through the bias lead, appears as an open circuit.

Other embodiments include devices with multiple input leads and/or multiple output leads (e.g., one input/output lead for each transistor). Still other embodiments include devices with bias leads formed as integral portions of the device, and additional conductive features that coupled the bias leads with the impedance matching network(s). Further, although the illustrated embodiments depict a single amplification stage (i.e., a single power transistor 220) along each amplification path, other device embodiments may include multi-stage amplifiers (e.g., transistor die with both pre-amplifier and high-power amplifier transistors coupled in cascade). Further still, some of the various components of the input and output impedance matching circuits and the video bandwidth circuits may be integrated into (or coupled to) the transistor die, in other embodiments.

As will be illustrated and explained in more detail below in conjunction with FIGS. 4-7, elements of the video bandwidth circuit 249 (e.g., video bandwidth circuit 149, FIG. 1) may be included as portions of the IPD assembly 242, in an embodiment. More specifically, in an embodiment, the envelope inductance (e.g., envelope inductor 136, FIG. 1), envelope resistor (e.g., envelope resistor 138, FIG. 1), and envelope capacitor (e.g., envelope capacitor 144, FIG. 1) are located in or on IPD assembly 242, and are electrically coupled with the rest of the output impedance matching circuit 250 through RF cold point node 248. In other embodiments, some or all elements of the video bandwidth circuit 249 may be implemented as discrete components that do not form a portion of an IPD assembly.

Figure 4:
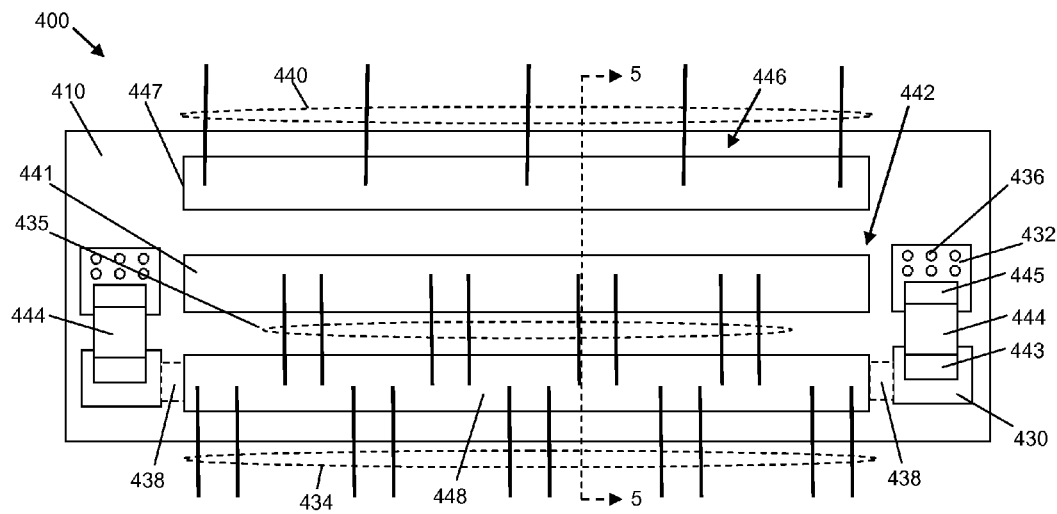
FIG. 4 is a top view of an integrated passive device (IPD) assembly that includes a portion of an output impedance matching circuit and an envelope frequency termination circuit, in accordance with an example embodiment.

FIG. 4 is a top view of an IPD assembly 400 (e.g., IPD assembly 242, FIG. 2) suitable for use in an output circuit (e.g., an out impedance matching circuit 150, 250 and video bandwidth circuit 149, 249, FIGS. 1, 2) in a packaged RF amplifier device (e.g., device 200, FIG. 2), in accordance with an example embodiment. For enhanced understanding, FIG. 4 should be viewed in conjunction with FIG. 5, which illustrates a cross-sectional, side view of IPD assembly 400 along line 5-5.

According to an embodiment, IPD assembly 400 includes an IPD substrate 410, and an RF cold point node 448 in the form of a conductive landing pad exposed at the top surface of IPD substrate 410. A first shunt inductance 434 (e.g., first shunt inductance 134, 234, FIGS. 1, 2), in the form of a plurality of bondwires, is coupled between a transistor (e.g., transistor 120, 220, FIGS. 1, 2) and the RF cold point node 448. In addition, and electrically coupled to the RF cold point node 448, IPD assembly 400 includes a second shunt inductance 435 (e.g., inductor 135, FIG. 1), a shunt capacitor 442 (e.g., capacitor 142, FIG. 1), envelope capacitors 444 (e.g., two parallel instances of capacitor 144, FIG. 1), envelope resistors 438 (e.g., two parallel instances of resistor 138, FIG. 1), and a low-pass matching capacitor 446 (e.g., capacitor 146, FIG. 1).

In the illustrated embodiment, the second shunt inductance 435 is implemented as a plurality of bondwires that are electrically connected between the RF cold point node 448 and a second conductive landing pad 441 that is exposed at the top surface of IPD substrate 410. Although FIG. 4 illustrates eight bondwires 435 coupled in parallel between the RF cold point node 448 and landing pad 441, more or fewer bondwires 435 may be implemented.

The second conductive landing pad 441 is electrically coupled to (or forms a portion of) the shunt capacitor 442. In an embodiment, shunt capacitor 442, envelope resistors 438, and low-pass matching capacitors 446 are integrally formed in the IPD substrate 410, and envelope capacitors 444 are discrete components that are mounted on a surface of the IPD substrate 410. In an alternate embodiment, envelope capacitor 444 also may be integrated into IPD substrate 410. In an embodiment in which low-pass matching circuit 147 is excluded, IPD assembly 400 may exclude low-pass matching capacitor 446 (e.g., capacitor 146, FIG. 1).

IPD substrate 410 includes a base semiconductor substrate 510 with top and bottom surfaces 512, 514. The base semiconductor substrate 510 may be formed from any of a variety of semiconductor materials, including but not limited to silicon, gallium arsenide, gallium nitride, and so on. A plurality of conductive layers 520, 522 and insulating layers 526, 528 are formed over the top surface 512 of the substrate 510, and an additional conductive layer 524 is formed on the bottom surface 514 of the substrate 512 to facilitate physical and electrical attachment to an underlying structure, according to an embodiment. For example, conductive layer 524 may be a gold (or other metal) layer, which facilitates forming a eutectic bond between IPD substrate 410 and a separate conductive substrate (e.g., flange 206, FIG. 2). Alternatively, conductive layer 524 may be a metal layer, which facilitates sintering (e.g., silver sintering) IPD substrate 410 to the separate conductive substrate. The insulating layer 526 functions to selectively electrically isolate the conductive layers 520, 522.

Figure 5:
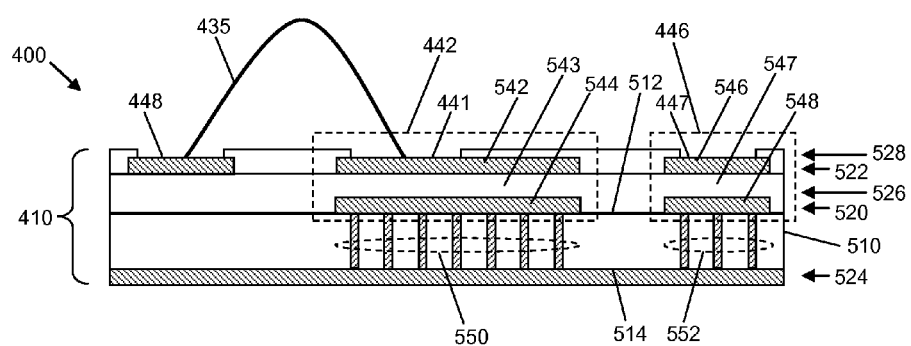
FIG. 5 is a cross-sectional side view of the IPD assembly of FIG. 4 along line 5-5.

Referring to FIGS. 4 and 5, and as mentioned above, IPD assembly 400 includes a second shunt inductance 435 implemented as a plurality of bondwires that are electrically connected between the RF cold point node 448 and a second conductive landing pad 441 (or the top capacitor electrode 542 of the shunt capacitor 442). The second shunt inductance 435 and the shunt capacitor 442 form a series resonant circuit in proximity to the center operating frequency of the RF power amplifier device, in an embodiment. More specifically, the second shunt inductance 435 and the shunt capacitor 442 are configured to have inductance and capacitance values, respectively, that will cause the series combination to resonate at a frequency that is in proximity to the center operating frequency of the device. As used herein, and according to an embodiment, the term "in proximity to the center operating frequency" means "within 20 percent of the center operating frequency." Accordingly, for example, when a device has a center operating frequency of 2.0 gigahertz (GHz), a frequency that is "in proximity to the center operating frequency" corresponds to a frequency that falls in a range from 1.8 GHz to 2.2 GHz. Although 2.0 GHz is given as an example center operating frequency, a device may have a center operating frequency that is different from 2 GHz, as well. In alternate embodiments, the term "in proximity to the center operating frequency" may mean "within 10 percent of the center operating frequency" or "within 5 percent of the center operating frequency."

A good approximation of the resonant frequency, $F_R$, of the series resonant circuit that includes the second shunt inductance 435, $L_{shunt2}$, and shunt capacitor 442, $C_{shunt}$, is given by:

$$F_R = \frac{1}{2\pi\sqrt{(L_{shunt2}C_{shunt})}}, \qquad \text{(Eqn. 1)}$$

Accordingly, for example, when the device is designed to have a center operating frequency of about 2.0 GHz, $L_{shunt2}$ may have an inductance value of about 39.5 pH, and $C_{shunt}$ may have a capacitance value of about 160 pF, although other values may be used, as well. In such an embodiment, reasonable approximate values for the other components of the output impedance matching and video bandwidth circuits 249, 250 may be selected as follows: $L_{series}$ 232=333 pH; $R_{env}$ 238=0.5 ohm; $C_{env}$=30 nF; $L_{env}$=70 pH; and $L_{shunt1}$=209.5 pH. Of course, other values may be selected as well, particularly when the center operating frequency of the device is different from 2.0 GHz.

According to an embodiment, shunt capacitor 442 and low-pass matching capacitor 446 each are implemented as metal-insulator-metal (MIM) capacitors (e.g., with parallel metal plates electrically separated by a thin dielectric (e.g., a thin nitride or oxide)). Accordingly, in an embodiment, shunt capacitor 442 includes a top capacitor electrode 542 formed from a portion of conductive layer 522, a bottom capacitor electrode 544 formed from a portion of conductive layer 520 and vertically aligned with the top capacitor electrode 542, and dielectric material 543 formed from a portion of insulating layer 526. Similarly, low-pass matching capacitor 446 includes a top capacitor electrode 546 formed from a portion of conductive layer 522, a bottom capacitor electrode 548 formed from a portion of conductive layer 520 and vertically aligned with the top capacitor electrode 546, and dielectric material 547 formed from a portion of insulating layer 526.

According to an embodiment, IPD substrate 410 also includes first and second sets of conductive through substrate vias (TSVs) 550, 552 extending between the top and bottom surfaces 512, 514 of substrate 510. The first set of TSVs 550 is electrically coupled to the bottom capacitor electrode 544 of shunt capacitor 442, and the second set of TSVs 552 is electrically coupled to the bottom capacitor electrode 548 of low-pass matching capacitor 446. In addition, both the first and second sets of TSVs 550, 552 are electrically coupled to the conductive layer 524 on the bottom surface 514 of the substrate 510. In an alternate embodiment, conductive pads or balls may be coupled to the ends of the TSVs 550, 552 that are coplanar with the bottom surface 514 of the substrate 510, rather than being electrically coupled to conductive layer 524. In yet another alternate embodiment, TSVs 550 and/or 552 may be replaced by edge plating or castellations on the side surface(s) of IPD substrate 410, which extend between the top and bottom surfaces of substrate 510.

IPD substrate 410 also includes a third conductive landing pad 447 exposed at the top surface of IPD substrate 410 to facilitate interconnection of low-pass matching capacitor 446 to external circuitry (e.g., output lead 104, 204, FIGS. 1, 2). More specifically, landing pad 447 is electrically connected to the top capacitor electrode 546 of the low-pass matching capacitor 446, and landing pad 447 is configured to accept attachment of one or more bondwires (e.g., bondwires 440). The landing pads 441, 447, 448 may be formed from the same conductive layer 522 as top electrodes 542, 546, as illustrated in FIG. 5, or the landing pads 441, 447, 448 may be formed from different conductive layers than top electrodes 542, 546.

Although the electrodes 542, 544, 546, 548 of the shunt and low-pass matching capacitors 442, 446 are illustrated as being formed from portions of the same conductive layers (i.e., layers 520, 522), the electrodes 542, 544, 546, 548 of capacitors 442, 446 may be formed from portions of different layers from each other and/or from different layers than those depicted in FIG. 5 (e.g., one or more other conductive layers, not illustrated, may be present below or above the conductive layers 520, 522 from which capacitors 442, 446 are formed). In addition, although each of capacitors 442, 446 are illustrated as simple parallel plate capacitors consisting of a single top electrode and a single bottom electrode, either or both of capacitors 442, 446 could have other types of capacitor structures, as well (e.g., the electrodes could consist of multiple, interleaved conductive structures, and so on).

As mentioned above, IPD assembly 400 also includes one or more series-coupled video bandwidth circuits (e.g., video bandwidth circuit 149, FIG. 1). In the illustrated embodiment, IPD assembly 400 includes two series coupled circuits, each including an envelope resistor 438 (e.g., resistor 138, FIG. 1), an envelope capacitor 444 (e.g., capacitor 144, FIG. 1), and a relatively small envelope inductance (e.g., inductance 136, FIG. 1) composed of a combination of small series inductances from conductive pads 430, 432, 448, and conductive TSVs 436 (indicated as dashed circles in FIG. 4), which extend between contact pads 432 and the bottom surface 514 of the IPD substrate 410. An advantage to the embodiments of FIGS. 4 and 5 is that the envelope inductance may be reduced to a negligible amount of inductance (e.g., <100 pH), which may improve performance by improving the low frequency resonance frequency of device.

In the embodiment illustrated in FIG. 4, the two video bandwidth circuits are positioned at and electrically connected to opposite ends of conductive pad 448 (or RF cold point node 448), and the two circuits are coupled in parallel between conductive pad 448 and conductive layer 524 (or the ground reference point). With the placement of multiple, parallel-coupled video bandwidth circuits on each side of conductive pad 448, the overall video bandwidth circuit may be much more uniformly fed, and the values of the individual components comprising each parallel-coupled video bandwidth circuit may be reduced (due to the parallel-coupling) when compared with conventional devices. In other embodiments, the video bandwidth circuit may include only one series-coupled circuit (e.g., only one capacitor 444 and one resistor 438) or more than two series-coupled circuits (e.g., more than two capacitors 444 and resistors 438).

The envelope resistor(s) 438 may be integrated as part of IPD substrate 410. For example, each envelope resistor 438 may be a polysilicon resistor formed from a layer of polysilicon overlying semiconductor substrate 510, and electrically coupled between conductive pads 448 and 430 (e.g., using conductive vias and possibly other conductive layers, not shown). In other alternate embodiments, the envelope resistor(s) 438 may be formed from tungsten silicide or another material, may be thick or thin film resistors, or may be discrete components coupled to a top surface of IPD substrate 410.

According to an embodiment, the envelope capacitor(s) 444 may be configured to have a relatively high voltage rating (e.g., between about 40 and about 150 volts, although the voltage rating may be higher or lower, in other embodiments). Each of the envelope capacitor(s) 444 may be, for example, a discrete capacitor that is connected (e.g., using solder, a conductive epoxy, or other means) to a top surface of IPD substrate 410. More specifically, a first terminal 443 of each capacitor 444 may be connected to a first contact pad 430 that is exposed at a top surface of the IPD substrate 410, and a second terminal 445 of each capacitor 444 may be connected to a second contact pad 432 that is exposed at the top surface of the IPD substrate 410.

Each capacitor 444 may be a multiple-layer capacitor (e.g., a multiple-layer ceramic capacitor) with parallel, interleaved electrodes and wrap-around end terminations 443, 445. Alternatively, each capacitor 444 may form a portion of a separate IPD (e.g., a MIM capacitor formed on a semiconductor substrate), or may be another capacitor (e.g., a trench or other type of capacitor) formed within IPD substrate 410. Alternatively, each capacitor 444 may be implemented as another type of capacitor capable of providing the desired capacitance and voltage for the video bandwidth circuit.

Contact pads 430, 432 may, for example, be formed from the same conductive layer 522 as conductive pads 441, 447, 448, although they may be formed from other conductive layers, as well. According to an embodiment, IPD substrate 410 also includes sets of TSVs 436, which electrically connect contact pad(s) 432 to conductive layer 524 (e.g., to the ground reference node). TSVs 436 essentially provide electrical connectivity between contact pad(s) 432 and the bottom surface 514 of substrate 510. In an alternate embodiment, conductive pads or balls may be coupled to the ends of the TSVs 436 that are coplanar with the bottom surface 514 of the substrate 510, rather than being electrically coupled to conductive layer 524. In yet another alternate embodiment, TSVs 436 may be replaced by edge plating or castellations on the side surface(s) of IPD substrate 410, which extend between the top and bottom surfaces of IPD substrate 410.

Figure 6:
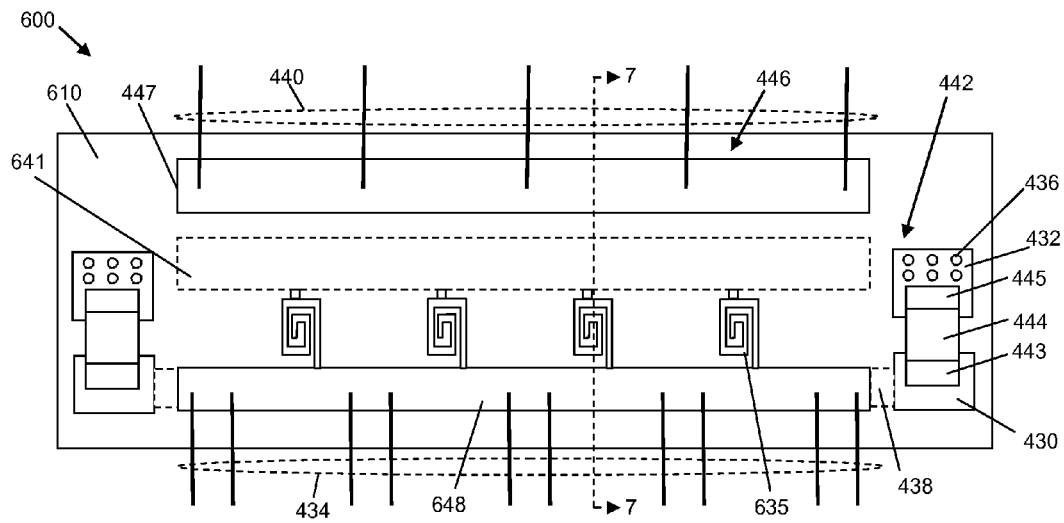
FIG. 6 is a top view of an IPD assembly that includes a portion of an output impedance matching circuit and an envelope frequency termination circuit, in accordance with another example embodiment.
Figure 7:
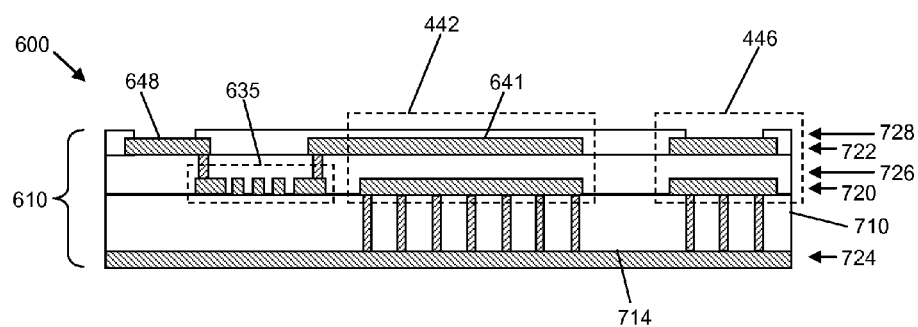
FIG. 7 is a cross-sectional side view of the IPD assembly of FIG. 6 along line 7-7.

In the embodiment of FIGS. 4 and 5, the second shunt inductance (e.g., inductance 135, FIG. 1) is implemented as a series of parallel-coupled bondwires. In an alternate embodiment, the second shunt inductance may be implemented as one or more integrated inductors. For example, FIGS. 6 and 7 illustrate a top view and a cross-sectional side view (along line 7-7 of FIG. 6) of an IPD assembly 600 (e.g., IPD assembly 242, FIG. 2), in accordance with another example embodiment. A number of the features of IPD assembly 600 may be substantially similar to corresponding features of IPD assembly 400, and where such similarities may exist (including all of the aforementioned alternate embodiments), the same reference numbers have been used. For purpose of brevity, not all of the potentially similar features will be discussed in detail in conjunction with FIGS. 6 and 7.

As with the embodiment of FIGS. 4 and 5, IPD assembly 600 includes an IPD substrate 610 formed from a base semiconductor substrate 710 and a plurality of conductive layers 720, 722 and dielectric layers 726, 728 overlying the base semiconductor substrate 710. In addition, IPD assembly 600 includes an integrated shunt capacitor 442 (e.g., shunt capacitor 142, FIG. 1) and an integrated low-pass matching capacitor 446 (e.g., low-pass matching capacitor 146, FIG. 1). Further, IPD assembly 600 includes two instances of video bandwidth circuits, each including an envelope resistor 438, an envelope capacitor 444, and envelope inductance (in the form of a series combination of contact pads 430, 432 and TSVs 436. Each video bandwidth circuit is electrically coupled between an RF cold point node 648 and a ground reference (e.g., conductive layer 724 on the bottom surface 714 of substrate 710).

In contrast with the embodiment of FIGS. 4 and 5, however, IPD assembly 600 includes a plurality of integrated inductors 635 to provide the second shunt inductance (e.g., second shunt inductance 135, FIG. 1), rather than using bondwires 435. For example, each integrated inductor 635 may be formed from a conductive coil that is implemented using one or more of the conductive layers 720, 722 overlying the semiconductor substrate 710. A first end of each coil is electrically connected to the RF cold point node 648, and a second end of each coil is electrically connected to conductive feature 641, which may in turn function as the top plate of shunt conductor 442. In this manner, each integrated inductor 635 is electrically coupled between the RF cold point node 648 and the shunt capacitor 442.

Although FIG. 6 illustrates four integrated inductors 635 coupled in parallel between the RF cold point node 648 and the shunt capacitor 442, more or fewer integrated inductors 635 may be implemented. Further, in still other embodiments, inductive components other than bondwires 435 or integrated inductors 635 may be used to provide the second shunt inductance.

The embodiments illustrated in FIGS. 4 and 6, each include two series-coupled circuits positioned proximate to opposite sides of IPD substrate 410, 610, with each including an envelope resistor 438 and an envelope capacitor 444. In other embodiments, either IPD assembly 400, 600 may have only one series-coupled circuit with one envelope resistor and one envelope capacitor, or may have more than two of such series coupled circuits. In addition, each of envelope resistor 438 and envelope capacitor 444 may be implemented as multiple components (coupled in series and/or in parallel), and/or the series arrangement may be different (e.g., envelope capacitor 444 may be coupled to conductive pad 448, 648 (or to RF cold point node 448, 648), and envelope resistor 438 may be coupled between envelope capacitor 444 and conductive layer 524, 724 (or the ground reference point)). Further, the series-coupled envelope resistor and envelope capacitor circuit(s) may be located at different positions on the IPD substrate 410, 610.

Although IPD substrates 410, 610 are illustrated as including only two conductive layers 520, 522, 620, 622 and two insulating layers 526, 528 626, 628 overlying the top surface 512, 612 of substrate 510, 610, alternate embodiments of an IPD that provides substantially the same functionality may include more than two conductive and/or insulating layers. In addition, although IPD assemblies 400, 600 each illustrate an embodiment that includes one shunt capacitor 442, two envelope capacitors 444, two envelope resistors 438, and one low-pass matching capacitor 446, alternate embodiments may include more than one shunt and/or low-pass matching capacitor 442, 446 (e.g., with sets of the same type of capacitor being arranged in parallel or series), and/or one or more than two envelope capacitors 444 and/or envelope resistors 438. In addition, although FIGS. 4 and 6 illustrate layouts in which the shunt and low-pass matching capacitors 442, 446 are arranged toward one side of the IPD assembly 400, 600, and the RF cold point node 448, 648 is arranged toward the other side of the IPD assembly 400, 600, the various components may be arranged differently, in other embodiments (e.g., the RF cold point node 448, 648 may be positioned between the shunt and low-pass matching capacitors 442, 446, and/or may be positioned closer to the output lead 204 than the shunt capacitor 442).

Figure 8:
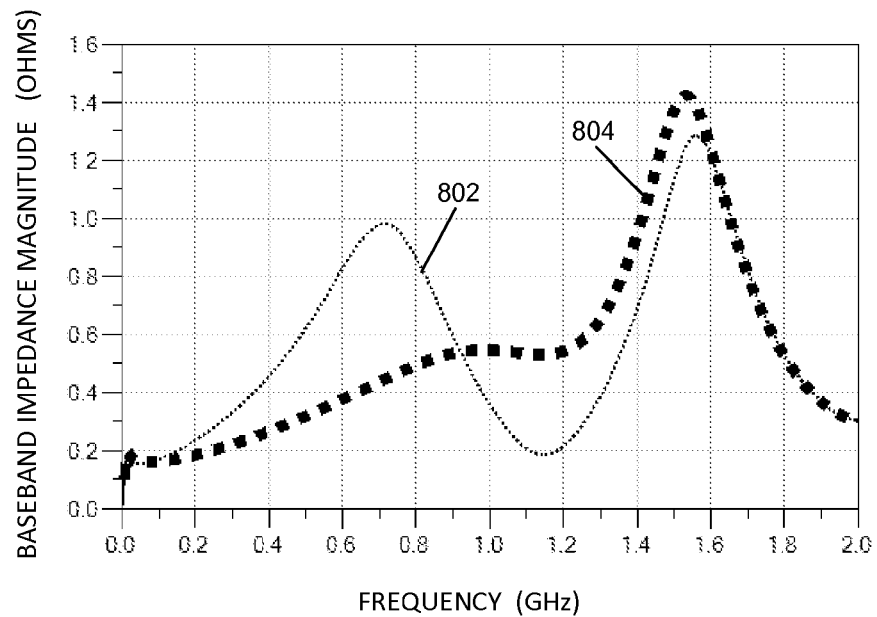
FIG. 8 is a chart comparing the magnitude of baseband impedance versus frequency for a conventional RF amplifier and an embodiment of an RF amplifier with a modified RF cold point.

As mentioned previously, by improving the RF cold point by dividing the shunt inductance in accordance with the above-described embodiments, the baseband impedance up to the LFR may be decreased. To illustrate the potential improvement in baseband impedance, FIG. 8 is a chart comparing the magnitude of baseband impedance (from the transistor drain looking toward the load) versus frequency for a conventional RF amplifier and an embodiment of an RF amplifier with a modified RF cold point. In FIG. 8, the x-axis represents frequency (in GHz), and the y-axis represents the magnitude of baseband impedance, $Z_{bb}$ or $Z_{env}$ (in ohms). Trace 802 represents the magnitude of baseband impedance over frequency for a conventional RF device in which a single shunt inductor (e.g., a single set of bondwires) is coupled between the transistor drain and the shunt capacitor, and the RF cold point is the node between the shunt inductor and capacitor. As trace 802 indicates, a significant resonance may occur below the desired LFR of the device. In this case, the resonance occurs at about 700 megahertz (MHz), where the baseband impedance bumps up to about 1.0 ohm.

Conversely, trace 804 represents the magnitude of baseband impedance over frequency for an embodiment of an RF device in which the shunt impedance is divided into two impedances (e.g., $L_{shunt1}$ 134 and $L_{shunt2}$ 135, FIG. 1), where the second impedance and the shunt capacitor form a series resonant circuit in proximity to the center operating frequency of the device. In such a configuration, with the improvement in the RF cold point, the value of the envelope inductor (e.g., $L_{env}$ 136) may be relatively low, as significantly less RF current may be present to flow through the video bandwidth circuit and be dissipated by the envelope resistor (e.g., $R_{env}$ 138). With the ability to have a relatively low value for the envelope inductor, trace 804 shows that the baseband impedance is significantly dampened (e.g., below 0.6 ohms) up to about 1.3 GHz. Further, with less RF current dissipation in the envelope resistor, the drain efficiency may be improved, as well.

Figure 9:
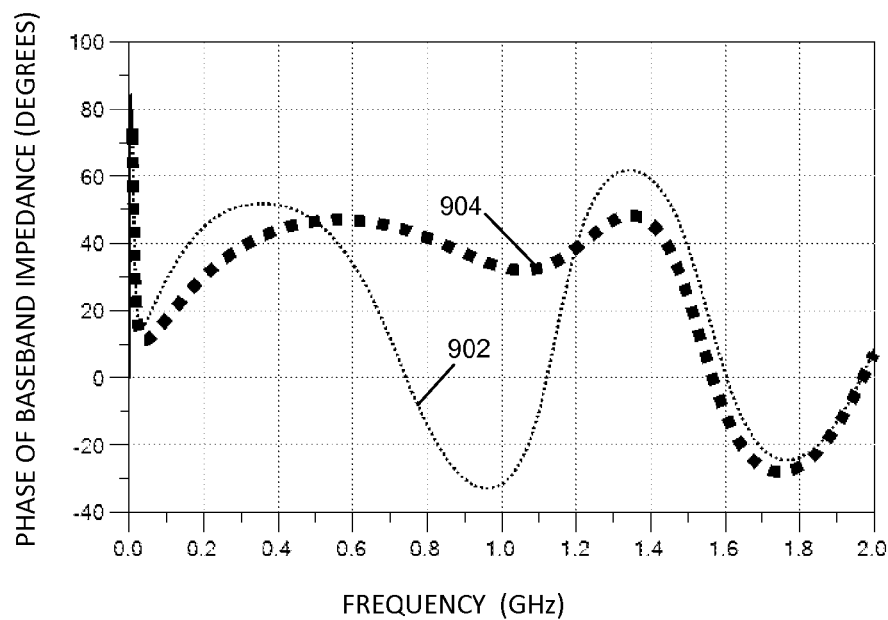
FIG. 9 is a chart comparing the phase change of baseband impedance versus frequency for a conventional RF amplifier and an embodiment of an RF amplifier with a modified RF cold point.

FIG. 9 is a chart comparing the phase change of baseband impedance versus frequency for a conventional RF amplifier and an embodiment of an RF amplifier with a modified RF cold point. In FIG. 9, the x-axis represents frequency (in GHz), and the y-axis represents phase of baseband impedance (in degrees). Trace 902 represents phase change over frequency for a conventional RF device in which a single shunt inductor (e.g., a single set of bondwires) is coupled between the transistor drain and the shunt capacitor, and the RF cold point is the node between the shunt inductor and capacitor.

Conversely, trace 904 represents phase change over frequency for an embodiment of an RF device in which the shunt impedance is divided into two impedances (e.g., $L_{shunt1}$ 134 and $L_{shunt2}$ 135, FIG. 1), where the second impedance and the shunt capacitor form a series resonant circuit in proximity to the center operating frequency of the device. In such a configuration, the phase change remains relatively flat up to the LFR of the device. In other words, trace 904 indicates that the variation of the baseband impedance phase may be smaller, when compared with the variation for a conventional device (trace 902), from DC to 1.5 GHz. This also may manifest itself in significantly improved device performance.

Figure 10:
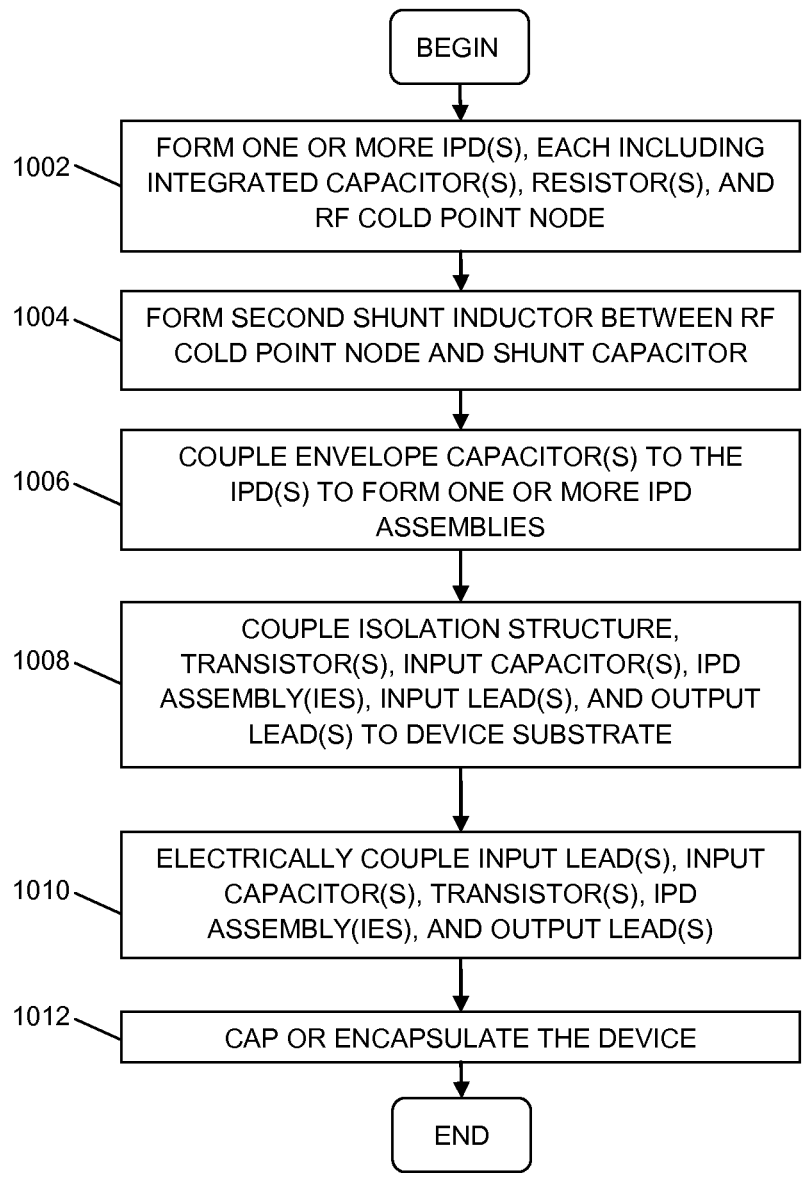
FIG. 10 is a flowchart of a method of manufacturing a packaged RF device, in accordance with an example embodiment.

FIG. 10 is a flowchart of a method of manufacturing a packaged RF device (e.g., device 200, FIG. 2) with a modified shunt inductor arrangement to provide an improved RF cold point, in accordance with an example embodiment. The method may begin, in blocks 1002-1006, by forming one or more IPD assemblies. For example, in block 1002, one or more IPDs (e.g., IPD 410, 610, FIGS. 4, 6) may be formed, each of which includes one or more integrated capacitors (e.g., shunt capacitor 442 and low-pass matching capacitor 446, FIGS. 4-7), and one or more envelope resistors (e.g., resistors 438, FIGS. 4, 6). In alternate embodiments, each IPD may exclude the low-pass matching capacitor and/or the envelope resistor(s) (e.g., the envelope resistor(s) may be implemented as discrete components later mounted to each IPD). In addition, in another embodiment, the IPD also may include one or more integrated high-capacitance, high-voltage envelope capacitors. In addition to forming the passive components of each IPD, forming each IPD also includes forming various conductive features (e.g., conductive layers and vias), which facilitate electrical connection between the various components of each IPD assembly.

Forming the IPD also includes forming an accessible RF cold point node (e.g., RF cold point node 448, 648, FIGS. 4-7) at a surface of the IPD. As discussed previously, the RF cold point node may be a conductive landing pad, which may accept attachment of a first shunt inductor (e.g., bondwires 234, 434 that extend from transistor 220). In addition, in the embodiment of FIGS. 4 and 5, the conductive landing pad also may serve as a launching point for bondwires 435 that make up the second shunt inductor (e.g., second shunt inductor 135, 235, 435, FIGS. 1, 3, 4).

In block 1004, and referring also to FIGS. 6 and 7, forming the IPD also may include forming and interconnecting one or more integrated inductors (e.g., corresponding to second shunt inductor 135, 235', 635, FIGS. 1, 3, 6) between the RF cold point node (e.g., RF cold point node 448, 648) and the shunt capacitor (e.g., shunt capacitor 442). Alternatively, and referring also to FIGS. 4 and 5, the second shunt inductor (e.g., corresponding to second shunt inductor 135, 235, 435, FIGS. 1, 3, 4) may be formed by coupling a plurality of bondwires between the RF cold point node and the shunt capacitor.

In block 1006, in embodiments in which the envelope capacitor is not integrated with the IPD, one or more discrete, high-voltage, high-capacitance envelope capacitors (e.g., capacitors 444, FIGS. 4, 6) are coupled to each IPD in series with the envelope resistor(s). As described previously, this results in the formation of one or more IPD assemblies, each of which includes at least an RF cold point node (e.g., RF cold point node 448, 648), a second shunt inductance (e.g., bondwires 435 or integrated inductors 635), a shunt capacitor (e.g., capacitor 442) and one or more video bandwidth circuit(s) coupled in parallel between the RF cold point node and a ground reference (e.g., conductive layer 524, 724, FIGS. 5, 7).

In block 1008, for an air cavity embodiment, an isolation structure (e.g., isolation structure 208, FIG. 2) is coupled to a device substrate (e.g., flange 206). In addition, one or more active devices (e.g., transistors 220), input impedance matching circuit elements (e.g., capacitors 214), and IPD assemblies (e.g., IPD assemblies 242, 400, 600) are coupled to a portion of the top surface of the substrate that is exposed through an opening in the isolation structure. Leads (e.g., input and output leads 202, 204, and bias leads, if included) are coupled to the top surface of the isolation structure. In an alternate embodiment, a conductive layer on the top surface of the isolation structure may be patterned and etched to form a leadframe (e.g., prior to coupling the isolation structure to the flange). For overmolded (e.g., encapsulated) device embodiments, the isolation structure may be excluded, and the substrate and leads may form portions of a leadframe.

In block 1010, the input lead(s), input capacitor(s), transistor(s), IPD assembly(ies), and output lead(s) are electrically coupled together. For example, the electrical connections may be made using bondwires between the various device components and elements, as discussed previously. Finally, in block 1012, the device is capped (e.g., with cap 310) or encapsulated (e.g., with mold compound, not illustrated). The device may then be incorporated into a larger electrical system.

An embodiment of an RF amplifier includes a transistor with a control terminal and first and second current carrying terminals, and a shunt circuit coupled between the first current carrying terminal and a ground reference node. The shunt circuit includes a first shunt inductance, a second shunt inductance, and a shunt capacitor coupled in series. The second shunt inductance and the shunt capacitor form a series resonant circuit in proximity to a center operating frequency of the amplifier, and an RF cold point node is present between the first and second inductances. The RF amplifier also includes a video bandwidth circuit coupled between the RF cold point node and the ground reference node.

An embodiment of a packaged RF amplifier device includes a device substrate, a transistor coupled to the device substrate, and a shunt circuit coupled to the device substrate. The transistor includes a control terminal and first and second current carrying terminals. The shunt circuit is coupled to the device substrate between the first current carrying terminal and a ground reference node. The shunt circuit includes a first shunt inductance, a second shunt inductance, and a shunt capacitor coupled in series. The second shunt inductance and the shunt capacitor form a series resonant circuit in proximity to a center operating frequency of the RF amplifier device, and an RF cold point node is present between the first and second inductances. The device also includes a video bandwidth circuit coupled to the device substrate between the RF cold point node and the ground reference node.

An embodiment of a method of manufacturing an RF amplifier device includes coupling a transistor to a device substrate, where the transistor includes a control terminal and first and second current carrying terminals. The method also includes coupling a shunt circuit to the device substrate between the first current carrying terminal and a ground reference node. The shunt circuit includes a first shunt inductance, a second shunt inductance, and a shunt capacitor coupled in series. The second shunt inductance and the shunt capacitor form a series resonant circuit in proximity to a center operating frequency of the RF amplifier device, and an RF cold point node is present between the first and second inductances. The method also includes coupling a video bandwidth circuit to the device substrate between the RF cold point node and the ground reference node.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) amplifier comprising:
   a transistor with a control terminal and first and second current carrying terminals;
   a shunt circuit coupled between the first current carrying terminal and a ground reference node, wherein the shunt circuit includes a first shunt inductance, a second shunt inductance, and a shunt capacitor coupled in series, and wherein the second shunt inductance and the shunt capacitor form a series resonant circuit in proximity to a center operating frequency of the amplifier, and an RF cold point node is present between the first and second shunt inductances; and
   a video bandwidth circuit coupled between the RF cold point node and the ground reference node.

2. The RF amplifier of claim 1, wherein the first shunt inductance comprises a first plurality of bondwires coupled between the first current carrying terminal and the RF cold point node, and the second shunt inductance comprises a second plurality of bondwires coupled between the RF cold point node and a first terminal of the shunt capacitor.

3. The RF amplifier of claim 1, wherein the first shunt inductance comprises a plurality of bondwires coupled between the first current carrying terminal and the RF cold point node, and the second shunt inductance comprises an integrated inductor coupled between the RF cold point node and a first terminal of the shunt capacitor.

4. The RF amplifier of claim 1, wherein the video bandwidth circuit comprises:
   a third inductance, a resistance, and a second capacitor coupled in series between the RF cold point node and the ground reference node.

5. The RF amplifier of claim 1, wherein:
   the first and second shunt inductors have a total inductance value in a range of 100 picohenries to 3 nanohenries; and
   the shunt capacitor has a capacitance value in a range of 50 picofarads to 500 picofarads.

6. A packaged radio frequency (RF) amplifier device comprising:
   a device substrate;
   a transistor coupled to the device substrate, wherein the transistor includes a control terminal and first and second current carrying terminals;
   a shunt circuit coupled to the device substrate between the first current carrying terminal and a ground reference node, wherein the shunt circuit includes a first shunt inductance, a second shunt inductance, and a shunt capacitor coupled in series, and wherein the second shunt inductance and the shunt capacitor form a series resonant circuit in proximity to a center operating frequency of the RF amplifier device, and an RF cold point node is present between the first and second shunt inductances; and
   a video bandwidth circuit coupled to the device substrate between the RF cold point node and the ground reference node.

7. The device of claim 6, wherein the first shunt inductance comprises a first plurality of bondwires coupled between the first current carrying terminal and the RF cold point node, and the second shunt inductance comprises a second plurality of bondwires coupled between the RF cold point node and a first terminal of the shunt capacitor.

8. The device of claim 7, further comprising:
   a passive device substrate coupled to the device substrate, wherein the passive device substrate includes the shunt capacitor, a first conductive pad corresponding to the RF cold point node, and a second conductive pad that is electrically coupled to a first terminal of the shunt capacitor, wherein the first and second conductive pads are exposed at a surface of the passive device substrate, the first plurality of bondwires is coupled to the first conductive pad, and the second plurality of bondwires is coupled between the first and second conductive pads.

9. The device of claim 6, wherein the first shunt inductance comprises a plurality of bondwires coupled between the first current carrying terminal and the RF cold point node, and the second shunt inductance comprises an integrated inductor coupled between the RF cold point node and a first terminal of the shunt capacitor.

10. The device of claim 9, further comprising:
    a passive device substrate coupled to the device substrate, wherein the passive device substrate includes the shunt capacitor, the integrated inductor, and a conductive pad corresponding to the RF cold point node, wherein the conductive pad is exposed at a surface of the passive device substrate, the first plurality of bondwires is coupled to the conductive pad, and the integrated inductor is coupled between the conductive pad and the first terminal of the shunt capacitor.

11. The device of claim 6, wherein the video bandwidth circuit comprises:
    a third inductance, a resistance, and a second capacitor coupled in series between the RF cold point node and the ground reference node.

12. The device of claim 11, further comprising:
    a passive device substrate coupled to the device substrate, wherein the passive device substrate includes the third inductance, the resistance, and the second capacitor.

13. The device of claim 11, wherein the third inductance has an inductance value of less than 100 picohenries.

14. The device of claim 6, wherein:
the first and second shunt inductors have a total inductance value in a range of 100 picohenries to 3 nanohenries; and
the shunt capacitor has a capacitance value in a range of 50 picofarads to 500 picofarads.

15. A method of manufacturing an RF amplifier device, the method comprising the steps of:
coupling a transistor to a device substrate, wherein the transistor includes a control terminal and first and second current carrying terminals;
coupling a shunt circuit to the device substrate between the first current carrying terminal and a ground reference node, wherein the shunt circuit includes a first shunt inductance, a second shunt inductance, and a shunt capacitor coupled in series, and wherein the second shunt inductance and the shunt capacitor form a series resonant circuit in proximity to a center operating frequency of the RF amplifier device, and an RF cold point node is present between the first and second shunt inductances; and
coupling a video bandwidth circuit to the device substrate between the RF cold point node and the ground reference node.

16. The method of claim 15, wherein coupling the shunt circuit comprises:
coupling a first plurality of bondwires between the first current carrying terminal and the RF cold point node, wherein the first plurality of bondwires corresponds to the first shunt inductance; and
coupling a second plurality of bondwires between the RF cold point node and a first terminal of the shunt capacitor, wherein the second plurality of bondwires corresponds to the second shunt inductance.

17. The method of claim 16, further comprising:
forming a passive device substrate that includes the shunt capacitor, a first conductive pad corresponding to the RF cold point node, and a second conductive pad that is electrically coupled to a first terminal of the shunt capacitor, wherein the first and second conductive pads are exposed at a surface of the passive device substrate, and
wherein coupling the shunt circuit to the device substrate comprises coupling the passive device substrate to the device substrate, coupling the first plurality of bondwires between the first current carrying terminal and the first conductive pad, and coupling the second plurality of bondwires between the first and second conductive pads.

18. The method of claim 15, wherein coupling the shunt circuit comprises:
coupling a plurality of bondwires between the first current carrying terminal and the RF cold point node, wherein the plurality of bondwires corresponds to the first shunt inductance; and
coupling one or more integrated inductors between the RF cold point node and a first terminal of the shunt capacitor, wherein the one or more integrated inductors corresponds to the second shunt inductance.

19. The method of claim 18, further comprising:
forming a passive device substrate that includes the shunt capacitor, a conductive pad corresponding to the RF cold point node, and the one or more integrated inductors, wherein the conductive pad is exposed at a surface of the passive device substrate, and
wherein coupling the shunt circuit to the device substrate comprises coupling the passive device substrate to the device substrate, and coupling the plurality of bondwires between the first current carrying terminal and the conductive pad.

20. The method of claim 15, further comprising:
forming a passive device substrate that includes the shunt capacitor, a conductive pad corresponding to the RF cold point node, and the video bandwidth circuit, wherein the video bandwidth circuit and the passive device substrate include a third inductance, a resistance, and a second capacitor coupled in series between the RF cold point node and the ground reference node, and
wherein coupling the video bandwidth circuit to the device substrate comprises coupling the passive device substrate to the device substrate, and
wherein coupling the shunt circuit to the device substrate includes coupling a plurality of bondwires between the first current carrying terminal and the conductive pad, wherein the plurality of bondwires corresponds to the first shunt inductance.

\* \* \* \* \*